(12) United States Patent
Lee et al.

(10) Patent No.: US 10,074,623 B2
(45) Date of Patent: Sep. 11, 2018

(54) METHOD OF FABRICATING REDISTRIBUTION CIRCUIT STRUCTURE

(71) Applicant: Taiwan Semiconductor Manufacturing Co., Ltd., Hsinchu (TW)

(72) Inventors: Tzung-Hui Lee, New Taipei (TW); Hung-Jui Kuo, Hsinchu (TW); Ming-Che Ho, Tainan (TW); Tzu-Yun Huang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/880,568

(22) Filed: Jan. 26, 2018

(65) Prior Publication Data

US 2018/0151521 A1   May 31, 2018

Related U.S. Application Data

(62) Division of application No. 15/164,888, filed on May 26, 2016, now Pat. No. 9,899,342.

(60) Provisional application No. 62/308,232, filed on Mar. 15, 2016.

(51) Int. Cl.
*H01L 23/00* (2006.01)

(52) U.S. Cl.
CPC .............. *H01L 24/02* (2013.01); *H01L 24/05* (2013.01); *H01L 24/11* (2013.01); *H01L 24/13* (2013.01); *H01L 2224/02315* (2013.01); *H01L 2224/02331* (2013.01); *H01L 2224/02373* (2013.01); *H01L 2224/02379* (2013.01); *H01L 2224/0401* (2013.01); *H01L 2224/05024* (2013.01);

(Continued)

(58) Field of Classification Search
CPC ......... H01L 24/02; H01L 24/05; H01L 24/13; H01L 24/11; H01L 2224/13026; H01L 2224/0401; H01L 2224/02315; H01L 2224/11015; H01L 2224/05024; H01L 2224/02331; H01L 2224/02379; H01L 2224/02373
USPC ....... 257/774, 522, 419, 773, 777, 758, 737, 257/499, 762, 764, 506; 438/303, 591, 438/618, 421, 584, 637, 783, 763
See application file for complete search history.

(56) References Cited

U.S. PATENT DOCUMENTS

2012/0009777 A1* 1/2012 Liu .................. H01L 24/03
438/614

* cited by examiner

*Primary Examiner* — Moin Rahman
(74) *Attorney, Agent, or Firm* — JCIPRNET

(57) ABSTRACT

A redistribution circuit structure electrically connected to at least one conductor underneath is provided. The redistribution circuit structure includes a dielectric layer, an alignment, and a redistribution conductive layer. The dielectric layer covers the conductor and includes at least one contact opening for exposing the conductor. The alignment mark is disposed on the dielectric layer. The alignment mark includes a base portion on the dielectric layer and a protruding portion on the base portion, wherein a ratio of a maximum thickness of the protruding portion to a thickness of the base portion is smaller than 25%. The redistribution conductive layer is disposed on the dielectric layer. The redistribution conductive layer includes a conductive via, and the conductive via is electrically connected to the conductor through the contact opening. A method of fabricating the redistribution circuit structure and an integrated fan-out package are also provided.

20 Claims, 16 Drawing Sheets

(52) U.S. Cl.
CPC ............... *H01L 2224/11015* (2013.01); *H01L 2224/13026* (2013.01)

METHOD OF FABRICATING REDISTRIBUTION CIRCUIT STRUCTURE

CROSS-REFERENCE TO RELATED APPLICATION

This application is a divisional application of U.S. application Ser. No. 15/164,888, filed on May 26, 2016, which claims the priority benefits of U.S. provisional application Ser. No. 62/308,232, filed on Mar. 15, 2016. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10' is a cross-sectional view illustrating the conductive via and the alignment mark in the redistribution circuit structure.

DETAILED DESCRIPTION

Figure 1:
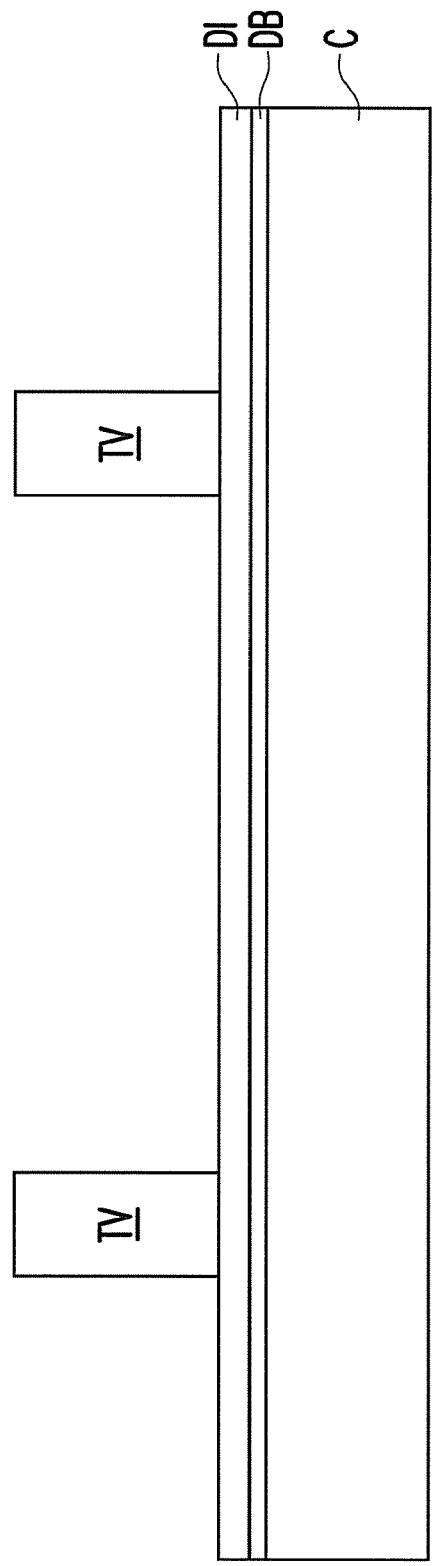
FIGS. 1 through 15 illustrate a process flow for fabricating a redistribution circuit structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 9:
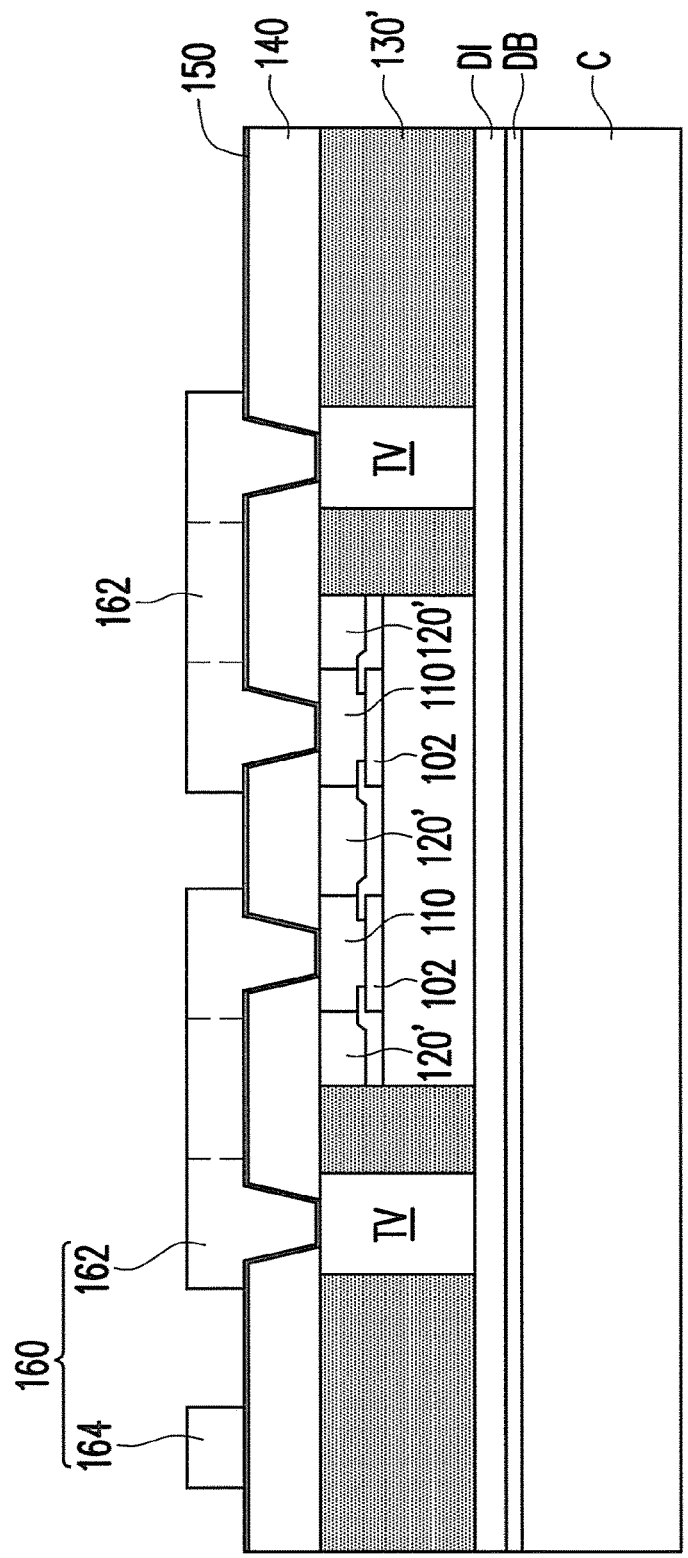
Figure 10:
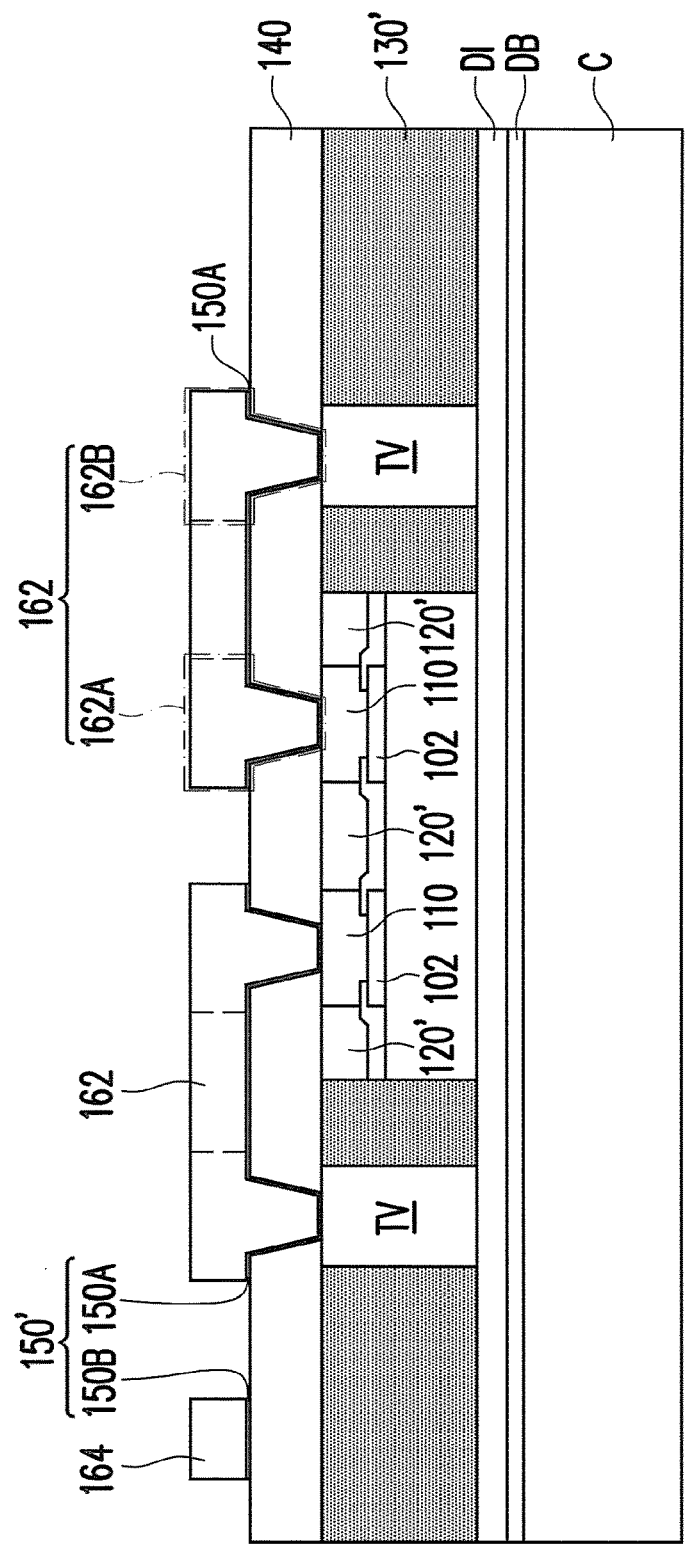
Figure 10:
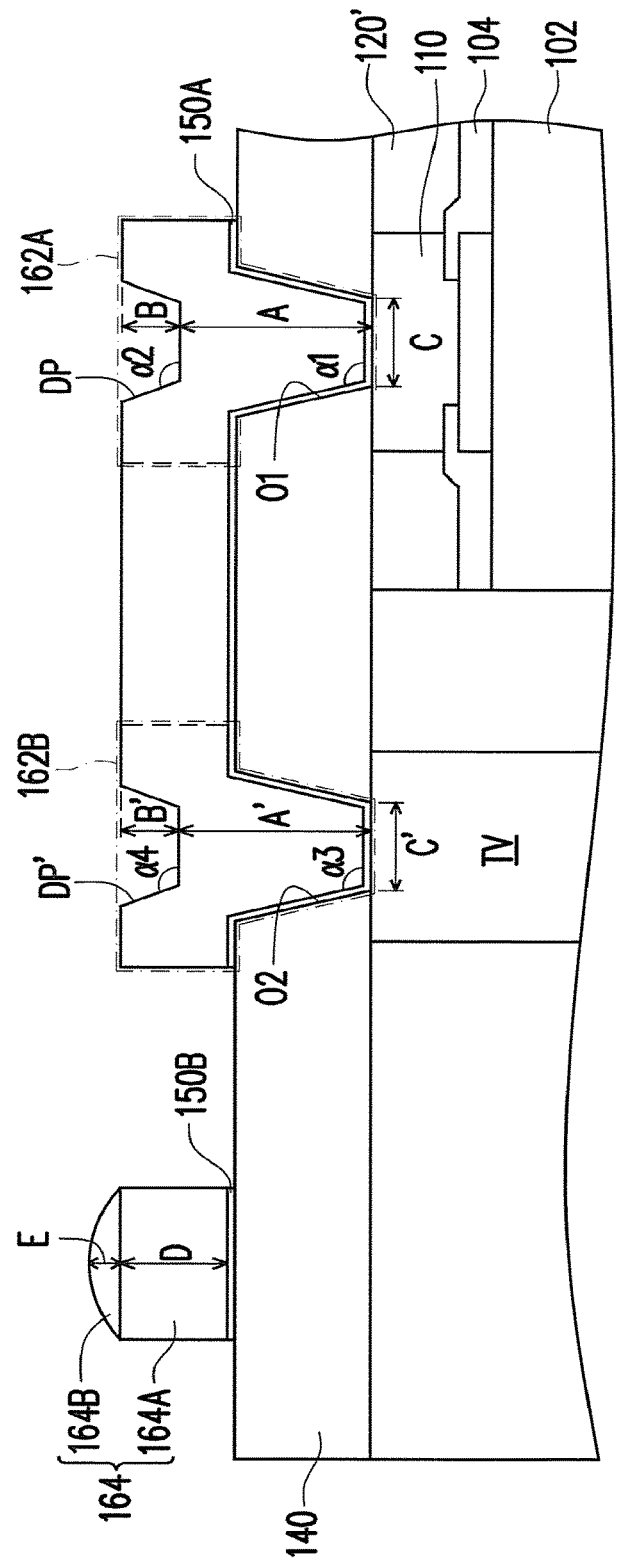

FIGS. 1 through 15 illustrate a process flow for fabricating a redistribution circuit structure in accordance with some embodiments, and FIG. 10' is a cross-sectional view illustrating the conductive via and the alignment mark in the redistribution circuit structure.

Referring to FIG. 1, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

After the carrier C having the de-bonding layer DB and the dielectric layer DI formed thereon is provided, a plurality of conductive through vias TV is formed on the dielectric layer DI. In some embodiments, the plurality of conductive through vias TV is formed by photolithography, plating, and photoresist stripping process. For example, the conductive through vias TV include copper posts.

Figure 2:
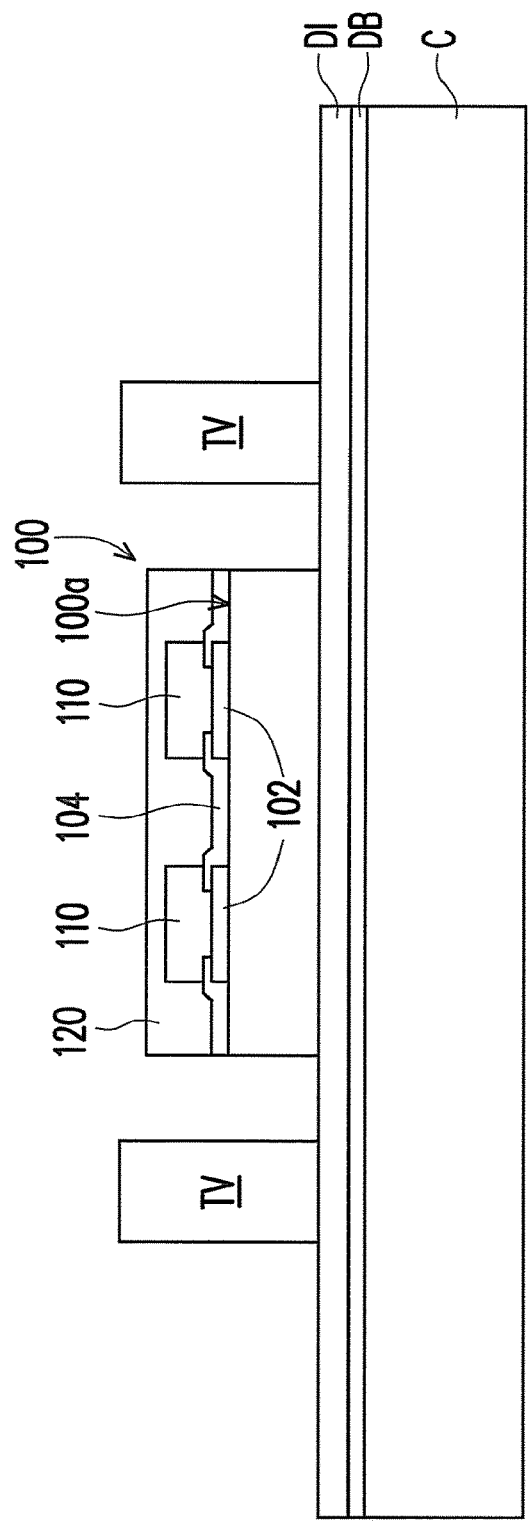

Referring to FIG. 2, an integrated circuit 100 including at least one conductive pillar 110 and a protection layer 120 formed thereon is picked and placed on the dielectric layer DI. In this embodiment, a plurality of conductive pillars 110 is formed on the integrated circuit 100 by photolithography, plating, and photoresist stripping process. The conductive pillars 110 are encapsulated by the protection layer 120. In some embodiments, the integrated circuit 100 may include an active surface 100a, a plurality of pads 102 distributed on the active surface 100a, and a passivation layer 104, wherein the passivation layer 104 covers the active surface 100a of the integrated circuit 100, and the pads 102 are partially exposed by the passivation layer 104. The conductive pillars 110 are formed on the pads 102 of the integrated circuit 100, and the protection layer 120 covers the conductive pillars 110 and the passivation layer 104. For example, the conductive pillars 110 are plated copper pillars, and the passivation layer 104 is a polybenzoxazole (PBO) layer. As shown in FIG. 2, the top surface of the protection layer 120 is lower than the top surfaces of the conductive through vias TV, and the top surface of the protection layer 120 is higher than the top surfaces of the conductive pillars 110, for example. However, the disclosure is not limited thereto.

In some alternative embodiments, the top surface of the protection layer 120 is substantially aligned with the top surfaces of the conductive through vias TV, and the top surface of the protection layer 120 is higher than the top surfaces of the conductive pillars 110.

As shown in FIG. 1 and FIG. 2, the integrated circuit 100 is picked and placed on the dielectric layer DI after the formation of the conductive through vias TV. However, the disclosure is not limited thereto. In some alternative embodiments, the integrated circuit 100 is picked and placed on the dielectric layer DI before the formation of the conductive through vias TV.

Figure 3:
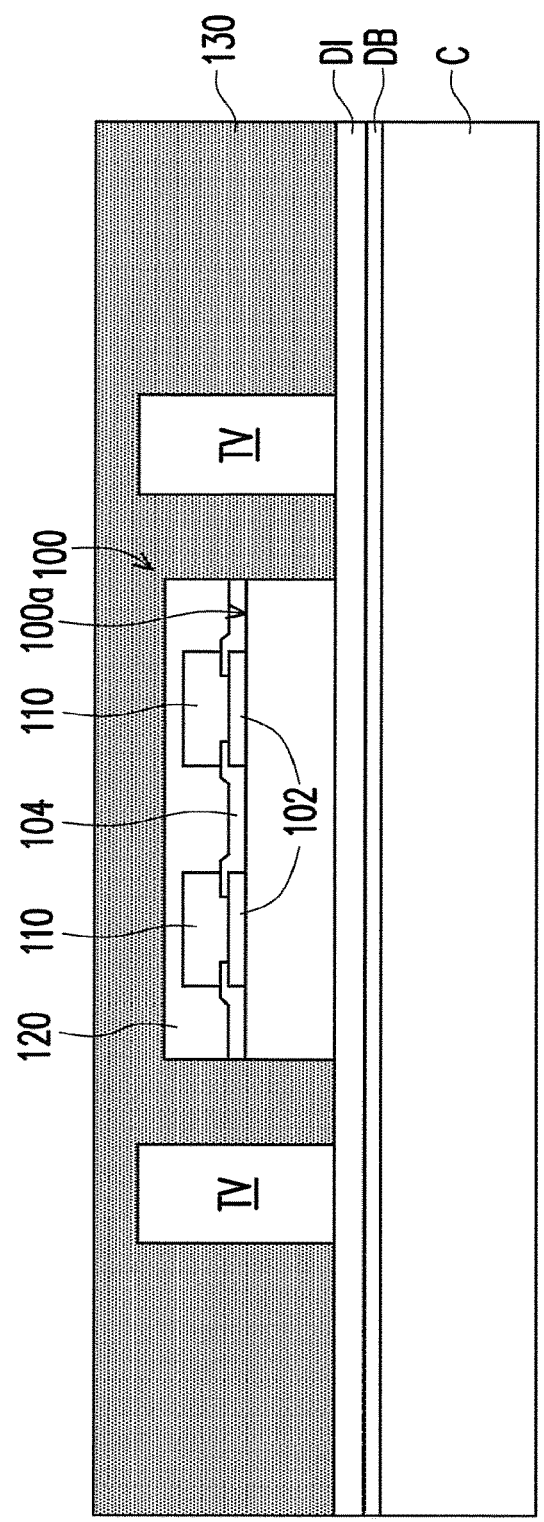

Referring to FIG. 3, an insulating material 130 is formed on the dielectric layer DI to cover the integrated circuit 100 and the conductive through vias TV. In some embodiments, the insulating material 130 is a molding compound formed by molding process. The conductive pillars 110 and the protection layer 120 of the integrated circuit 100 are covered by the insulating material 130. In other words, the conductive pillars 110 and the protection layer 120 of the integrated circuit 100 are not revealed and are well protected by the insulating material 130 during the formation of the insulating material 130. In some embodiments, the insulating material 130 includes epoxy or other suitable resins.

Figure 4:
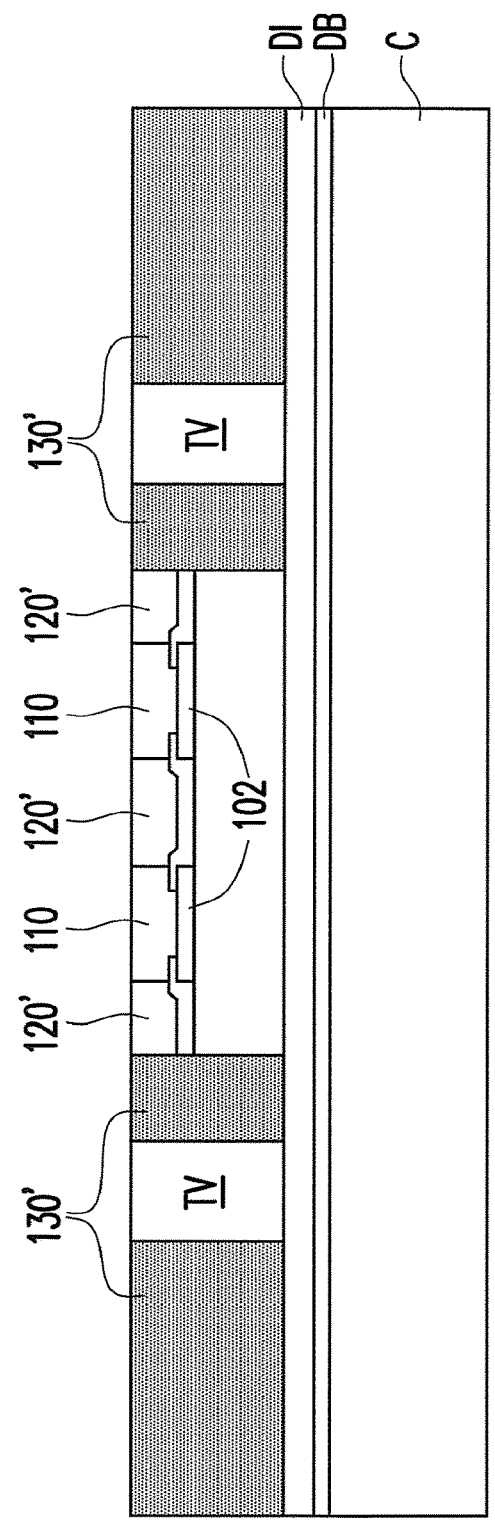

Referring to FIG. 4, the insulating material 130 is then grinded until the top surfaces of the conductive pillars 110, the top surfaces of the conductive through vias TV, and the top surface of the protection layer 120 are exposed. After the insulating material 130 is grinded, an insulating encapsulation 130' is formed. During the grinding process of the insulating material 130, portions of the protection layer 120 are grinded to form a protection layer 120'. In some embodiments, during the grinding process of the insulating material 130 and the protection layer 120, portions of the conductive through vias TV are grinded also. The insulating material 130 and the protection layer 120 are grinded through chemical mechanical polishing (CMP) process, for example. As shown in FIG. 4, it is noted that the top surfaces of the conductive through vias TV, the top surface of the insulating encapsulation 130', the top surfaces of the conductive pillars 110, and the top surface of the protection layer 120' are substantially coplanar.

Referring to FIG. 5 through FIG. 11, after the insulating encapsulation 130' and the protection layer 120' is formed, a redistribution circuit structure RDL (shown in FIG. 11) electrically connected to the conductive pillars 110 of the integrated circuit 100 is formed on the top surfaces of the conductive through vias TV, the top surface of the insulating encapsulation 130', the top surfaces of the conductive pillars 110, and the top surface of the protection layer 120'. The redistribution circuit structure RDL (shown in FIG. 11) is fabricated to electrically connect with at least one connector underneath. Here, the afore-said connector(s) may be the conductive pillars 110 of the integrated circuit 100 and/or the conductive through vias TV embedded in the insulating encapsulation 130'. The fabrication of the redistribution circuit structure RDL (shown in FIG. 11) is described in accompany with FIG. 5 through FIG. 11 in detail.

Figure 5:
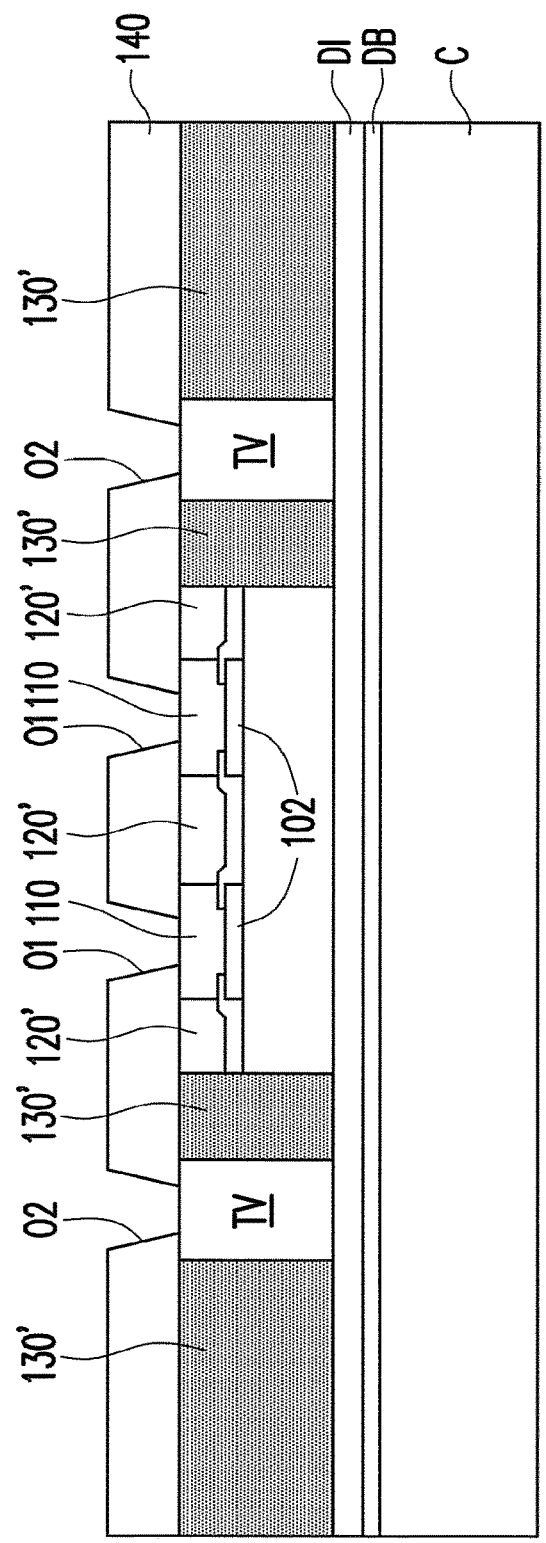

Referring to FIG. 5, a dielectric layer 140 is formed on the top surfaces of the conductive through vias TV, the top surface of the insulating encapsulation 130', the top surfaces of the conductive pillars 110, and the top surface of the protection layer 120'. The dielectric layer 140 includes at least one contact opening O1 and at least one contact opening O2. In this embodiment, a plurality of contact openings O1 for exposing the top surfaces of the conductive pillars 110 and a plurality of contact openings O2 for exposing the top surfaces of the conductive through vias TV are formed in the dielectric layer 140. It is noted that the number of the contact openings O1 is corresponding to the number of the conductive pillars 110, and the number of the contact openings O2 is corresponding to the number of the conductive through vias TV. In some embodiments, the dielectric layer 140 is a polybenzoxazole (PBO) layer, for example.

Figure 6:
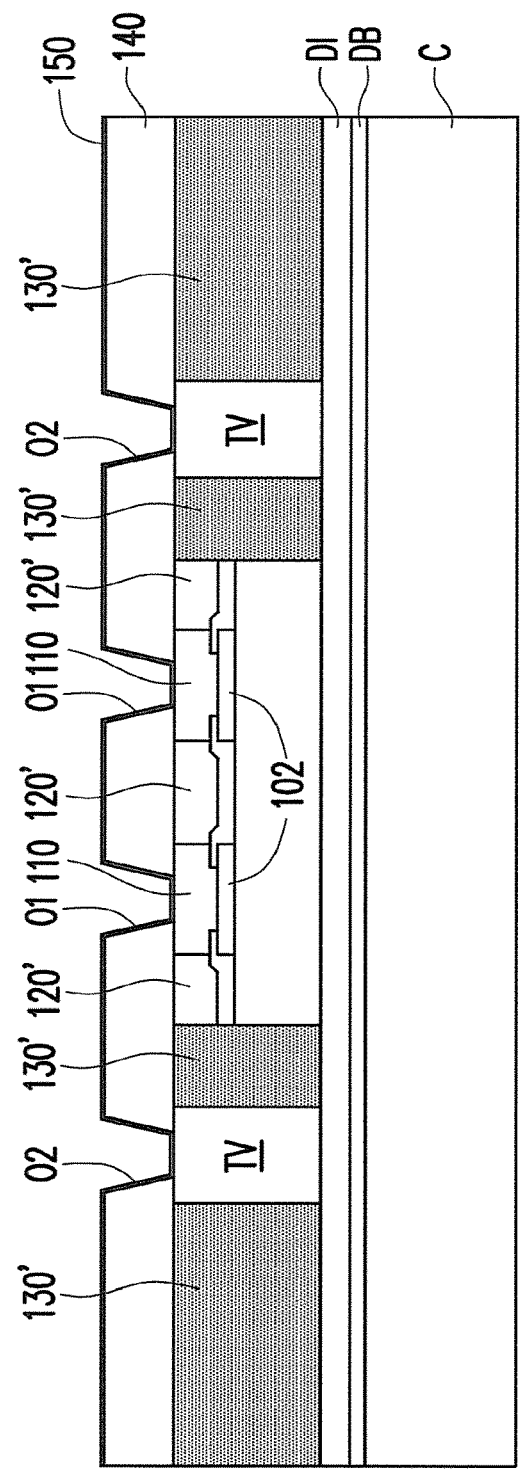

Referring to FIG. 6, after the dielectric layer 140 having the contact openings O1 and the contact openings O2 is formed, a seed layer 150 is sputtered, for example, on the dielectric layer 140, the top surfaces of the conductive pillars 110 exposed by the contact opening O1, and the top surfaces of the conductive through vias TV exposed by the contact opening O2 conformally. In some embodiments, the seed layer 150 is, for example, a titanium/copper composited layer, wherein the sputtered titanium thin film is in contact the dielectric layer 140, the top surfaces of the conductive pillars 110 exposed by the contact opening O1, and the top surfaces of the conductive through vias TV exposed by the contact opening O2. In addition, the sputtered copper thin film is formed on the sputtered titanium thin film.

Figure 7:
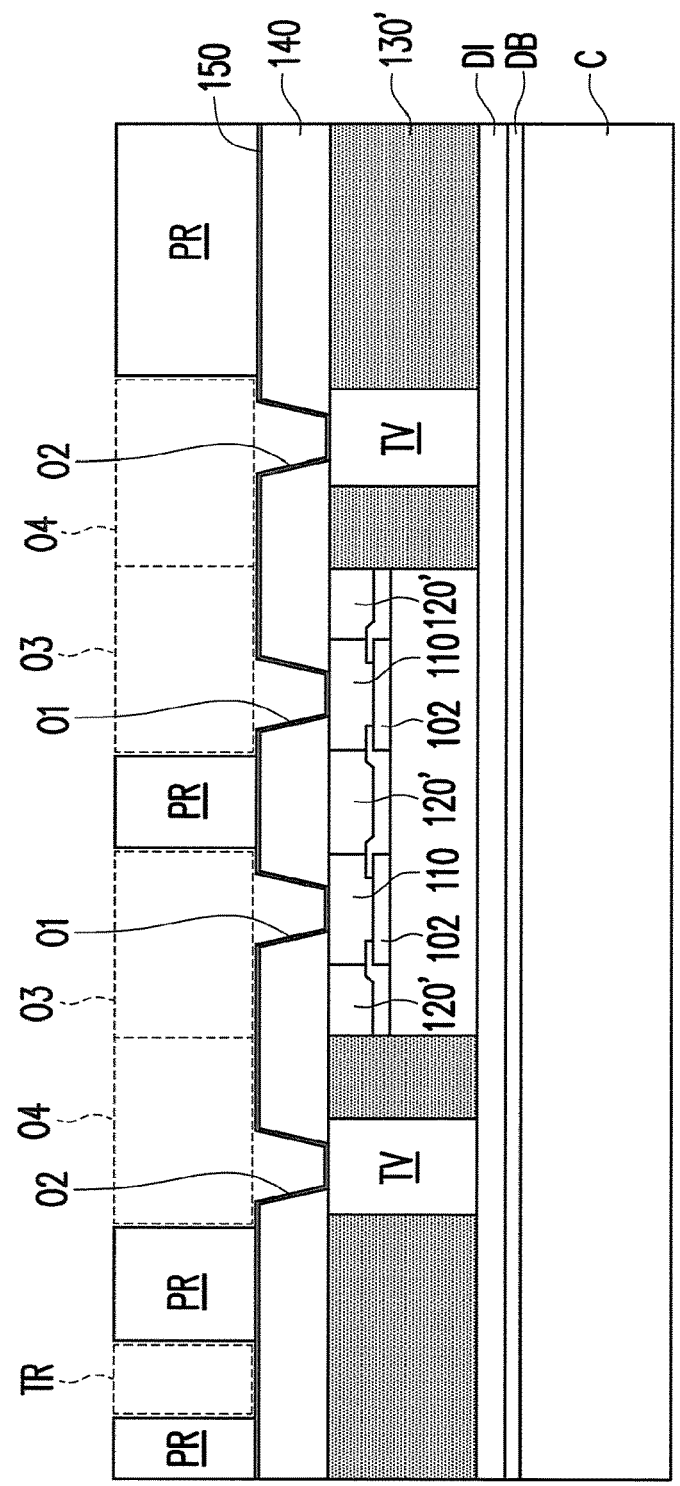

Referring to FIG. 7, a patterned photoresist layer PR is formed on the seed layer 150, wherein the patterned photoresist layer PR includes at least one opening O3, at least one opening O4, and at least one trench TR. In this embodiment, a plurality of openings O3 and a plurality of openings O4 are formed in the patterned photoresist layer PR. It is noted that the number of the openings O3 is corresponding to the number of the contact openings O1, and the number of the openings O4 is corresponding to the number of the contact openings O2. The number of the trench TR is not limited in this disclosure. The openings O3 are located above the contact opening O1, and the openings O4 are located above the contact opening O2. As shown in FIG. 7, portions of the seed layer 150 are exposed by the openings O3, the openings O4, and the trench TR.

Figure 8:
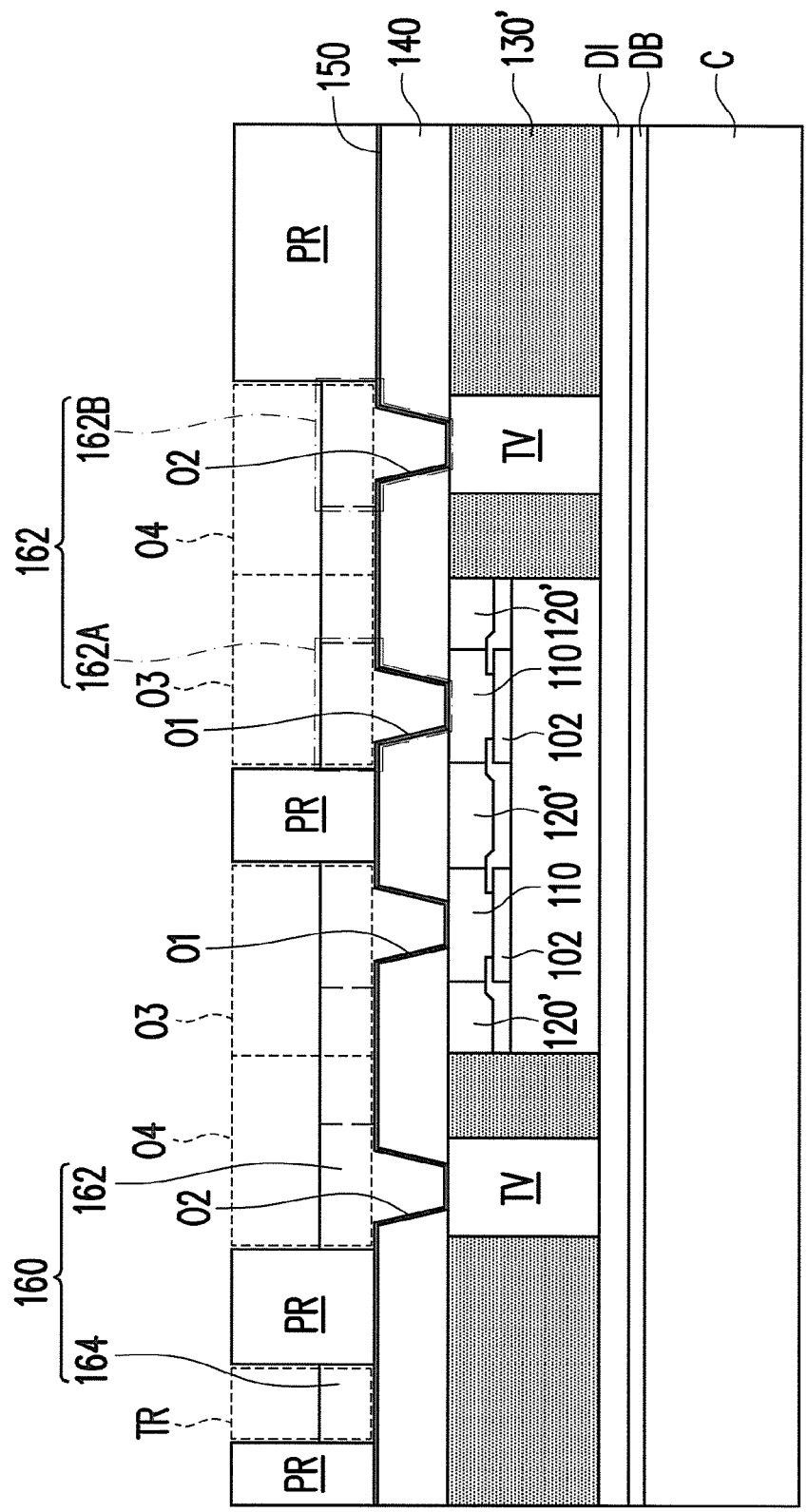

Referring to FIG. 8, after the patterned photoresist layer PR is formed, a multi-step plating process is performed to form a patterned conductive layer 160 on the portions of the seed layer 150 exposed by the openings O3, the openings O4, and the trench TR. The patterned conductive layer 160 formed by the multi-step plating process may include a redistribution conductive layer 162 and at least one alignment mark 164, wherein the redistribution conductive layer 162 is formed in the openings O3 and the openings O4, and the alignment mark 164 is formed in the trench TR. The redistribution conductive layer 162 includes at least one conductive via 162A electrically connected to the conductive pillar 110 through the contact opening O1 and at least one conductive via 162B electrically connected to the conductive through vias TV through the contact opening O2. In this embodiment, a plurality of conductive vias 162A and conductive vias 162B are plated on the portions of the seed layer 150 exposed by the patterned photoresist layer PR. It is noted that the number of the conductive vias 162A is corresponding to the number of the conductive pillar 110, and the number of the conductive vias 162B is corresponding to the number of the conductive through vias TV. Additionally, the number of the alignment mark 164 is corresponding to the trench TR.

As shown in FIG. 8, the conductive vias 162A are plated on portions of the seed layer 150 that are exposed by the contact opening O1 and opening O3, the conductive vias 162B are plated on portions of the seed layer 150 that are exposed by the contact opening O2 and opening O4, and the alignment mark 164 is plated on a portion of the seed layer 150 that are exposed by the trench TR. The conductive vias 162A are formed above the conductive pillars 110, and the conductive vias 162B are formed above the conductive through vias TV.

In some embodiments, the multi-step plating process for forming the patterned conductive layer 160 may include two plating steps. For example, a first plating process is performed to form a first plated conductive layer on the seed layer 150 exposed by the openings O3, the openings O4, and the trench TR, and a second plating process is then performed to form a second plated conductive layer on the first plated conductive layer. Since the first plated conductive layer and the second plated conductive layer are formed by plating processes with different recipes, there may be no obvious interface between the first plated conductive layer and the second plated conductive layer.

It is noted that the first plating process is performed at higher plating density (e.g. greater than 2 ASD) and weak agitation, and the second plating process is performed at lower plating current density (e.g. less than 2 ASD) and stronger agitation.

In some alternative embodiments, the multi-step plating process includes more than two plating steps, and more than two stacked and plated conductive layers are formed on the seed layer 150.

Referring to FIG. 9, after the multi-step plating process is performed, the patterned photoresist layer PR is stripped such that portions of the seed layer 150 that are not covered by the redistribution conductive layer 162 and the alignment mark 164 are exposed.

Referring to FIG. 10, by using the redistribution conductive layer 162 and the alignment mark 164 as hard masks, the portions of the seed layer 150 uncovered by the redistribution conductive layer 162 and the alignment mark 164 are removed so as to form a patterned seed layer 150'. The patterned seed layer 150' comprises at least one first seed pattern 150A and at least one second seed pattern 150B, wherein the first seed pattern 150A is formed between the conductive pillar 110 of the integrated circuit 100 and the conductive vias 162A of the redistribution conductive layer 162, and the second seed pattern 150B is formed between the dielectric layer 140 of the integrated circuit 110 and the alignment mark 164. In some embodiments, the seed layer 150 is patterned by etching until the dielectric layer 140 is exposed.

During the patterning of the seed layer 150, since the top surfaces of the redistribution conductive layer 162 and the alignment mark 164 formed by the multi-step plating process are flat and smooth, damage issue of the redistribution conductive layer 162 and the alignment mark 164 resulted from the etching process may be minimized. In other words, the etching process utilized to patterning the seed layer 150 does not causes serious damage on the top surfaces of the redistribution conductive layer 162 and the alignment mark 164. Accordingly, the conductive vias 162A and 162B of the redistribution conductive layer 162 has good via filling capability, and the alignment mark 164 is easy to be recognized during alignment procedures are performed.

In some embodiments, the minimum distance from the conductive pillar 110 to the top surface of the conductive vias 162A is greater than the maximum thickness of the alignment mark 164; and the minimum distance from the conductive through vias TV to the top surface of the conductive vias 162B is greater than the maximum thickness of the alignment mark 164.

In some embodiments, the conductive vias 162A and the conductive vias 162B formed by the multi-step plating process may include flat and smooth top surfaces, and there is almost no obvious depression formed on the top surface of the conductive vias 162A and the conductive vias. However, the disclosure is not limited thereto. In some alternative embodiments, after the multi-step plating process is performed, depressions may be formed on the top surfaces of the conductive vias 162A and the conductive vias 162B, and the alignment mark 164 may have a dome-shaped top surface, as shown in FIG. 10'.

Referring to FIG. 10', the conductive vias 162A include a depression DP on the top surface thereof, and the minimum distance A from the conductive pillar 110 to the top surface of the conductive vias 162A or to the bottom of the depression DP is greater than the depth B of the depression DP. For example, the minimum distance A from the conductive pillar 110 to the top surface of the conductive vias 162A or to the bottom of the depression DP ranges from 2 micrometers to 12 micrometers, and the depth B of the depression DP is smaller than 0.5 micrometer. The exposed area of the conductive pillar 110 is exposed by the contact opening O1, and the diameter C of the exposed area is smaller than or equals to 50 micrometers, for example.

Similarly, in some embodiments, the conductive vias 162B include a depression DP' on the top surface thereof, and the minimum distance A' from the conductive through vias TV to the top surface of the conductive vias 162B or to the bottom of the depression DP' is greater than the depth B' of the depression DP'. For example, the minimum distance A' from the conductive through vias TV to the top surface of the conductive vias 162B or to the bottom of the depression DP' ranges from 2 micrometers to 12 micrometers, and the depth B' of the depression DP' is smaller than 0.5 micrometer. The exposed area of the conductive through vias TV is exposed by the contact opening O2, and the diameter C' of the exposed area is smaller than or equals to 50 micrometers, for example.

As shown in FIG. 10', the depression DP is distributed above and outside the contact opening O1, and the depression DP' is distributed above and outside the contact opening O2.

As shown in FIG. 10', an exposed area of one of the conductive pillars 110 is exposed by the contact opening O1, the dielectric layer 140 has a first sidewall around the contact opening O1, a first obtuse angle α1 is included between the exposed area of the conductive pillar 110 and the first sidewall, the conductive via 162A has a second sidewall around the depression DP, a second obtuse angle α2 is included between the bottom of the depression DP and the second sidewall, and the second obtuse angle α2 is greater than the first obtuse angle α1. Similarly, an exposed area of one of the conductive through vias TV is exposed by the contact opening O2, the dielectric layer 140 has a third sidewall around the contact opening O2, a third obtuse angle α3 is included between the exposed area of the conductive through via TV and the third sidewall, the conductive via 162A has a fourth sidewall around the depression DP', a fourth obtuse angle α4 is included between the bottom of the depression DP' and the fourth sidewall, and the fourth obtuse angle α4 is greater than the third obtuse angle α3.

Referring to FIG. 10', the alignment mark 164 may include a base portion 164A on the dielectric layer 140 and a protruding portion 164B on the base portion 164A, wherein the protruding portion 164B includes the dome-shaped top surface, and a ratio of the maximum thickness E of the protruding portion 164B to the thickness D of the base portion 164A is smaller than 25%. In some embodiments, the minimum distance A from the conductive pillar 110 to the top surface of the conductive vias 162A or to the bottom of the depression DP is greater than the sum (i.e. D+E) of the maximum thickness E of the protruding portion and the thickness of the base portion D. In other words, the minimum distance A is greater than the maximum thickness of the alignment mark 164. For instance, the maximum thickness E of the protruding portion 164B is smaller than 0.5 micrometer, and the thickness of the base portion D ranges from 1.5 micrometer to 27 micrometers.

In the afore-said embodiments, since the redistribution conductive layer 162 and the alignment mark 164 is formed by the multi-step plating process, the conductive vias 162A and 162B of the redistribution conductive layer 162 may be advantage in good via filling capability, high lithography resolution, and short signal transmission path; and the alignment mark 164 may be advantage in high lithography resolution and good surface profile.

Figure 11:
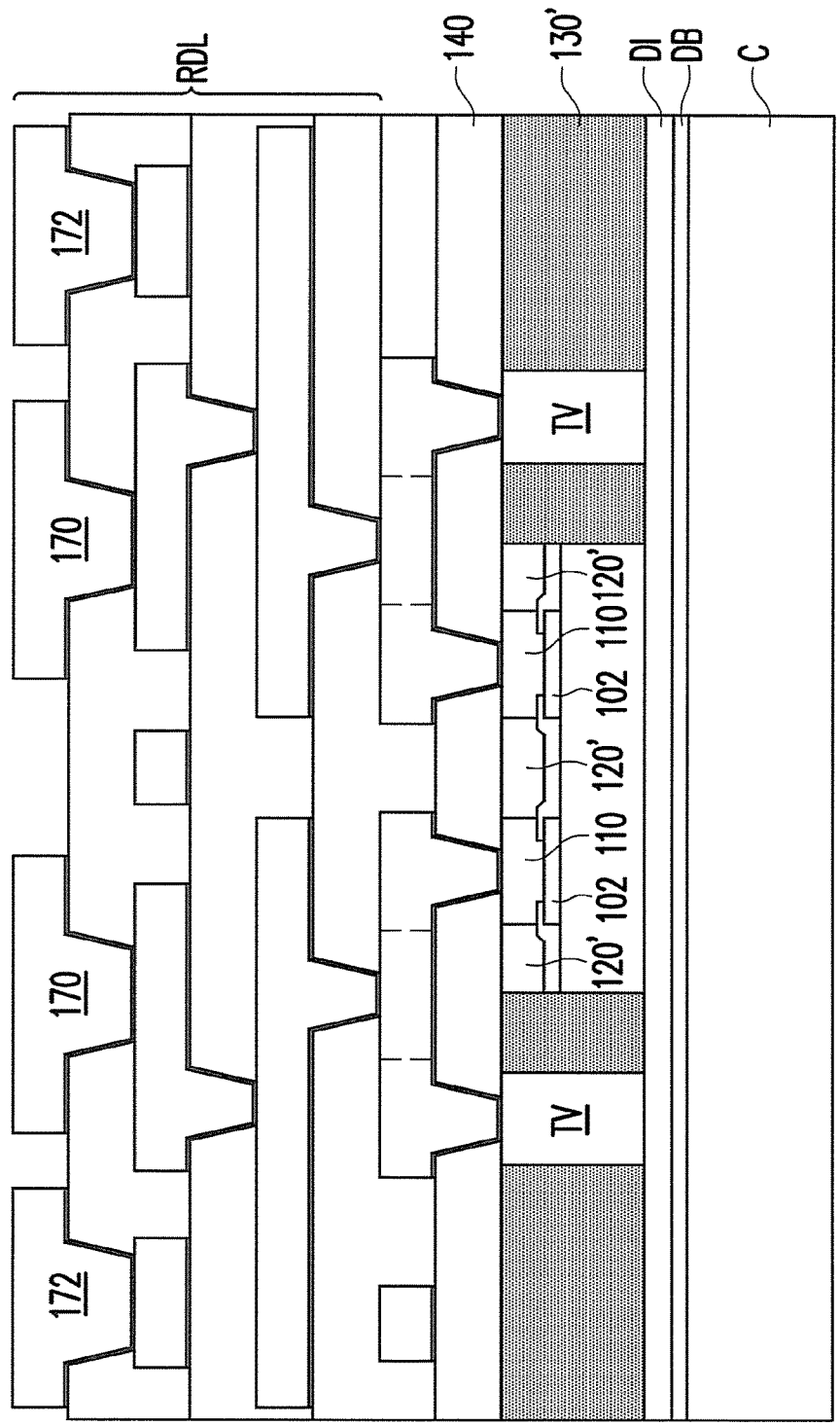

Referring to FIG. 11, after the dielectric layer 140 and the patterned conductive layer 160 are formed, steps illustrated in FIG. 5 through 10 can be repeated at least one time so as to fabricate the redistribution circuit structure RDL over the integrated circuit 100 and the insulating encapsulation 130'. The redistribution circuit structure RDL includes a plurality of dielectric layers and a plurality of patterned conductive layer stacked alternately. In some embodiment, the topmost patterned conductive layer of the redistribution circuit structure RDL may include a plurality of under-ball metallurgy (UBM) patterns 170 for electrically connecting with conductive balls and/or at least one connection pad 172 for electrically connecting with at least one passive component. In this embodiment, a plurality of connection pads 172 are formed. The number of the under-ball metallurgy patterns 170 and the connection pad 172 is not limited in this disclosure.

Figure 12:
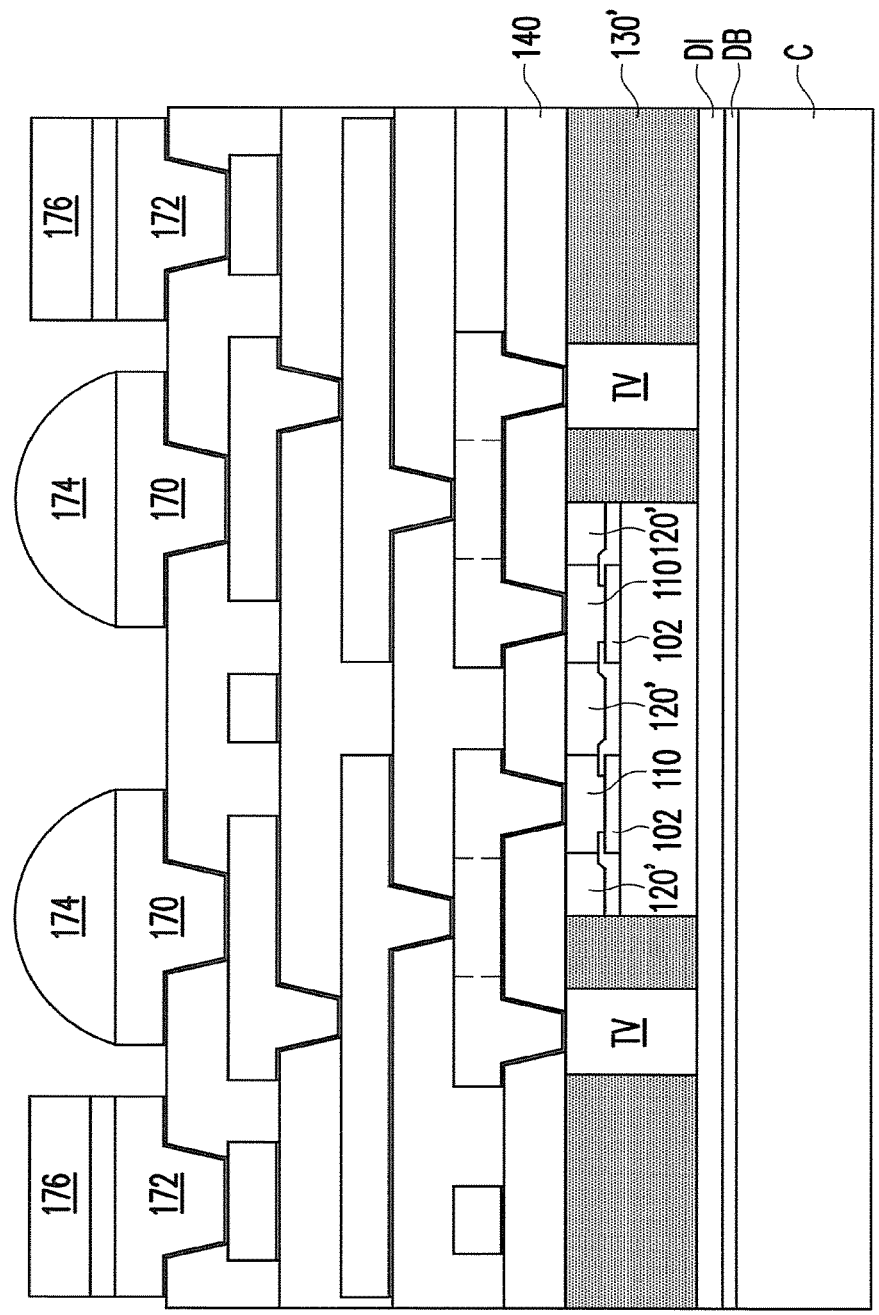

Referring to FIG. 12, after the redistribution circuit structure RDL is formed, a plurality of conductive balls 174 are placed on the under-ball metallurgy patterns 170, and a plurality of passive components 176 are mounted on the connection pads 172. In some embodiments, the conductive balls 174 may be placed on the under-ball metallurgy patterns 170 by ball placement process, and the passive components 176 may be mounted on the connection pads 172 through reflow process.

Figure 13:
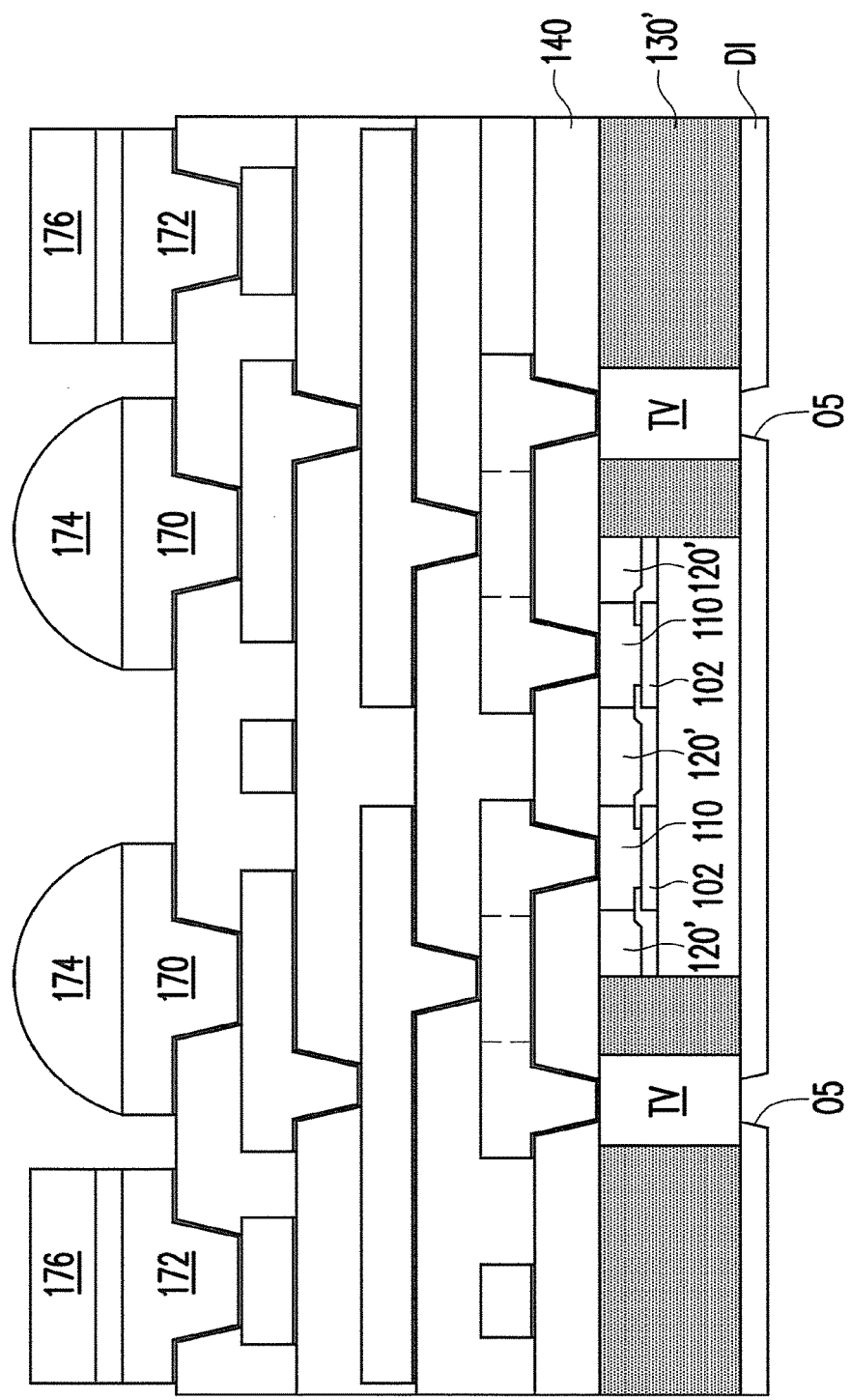

Referring to FIG. 12 and FIG. 13, after the conductive balls 174 and the passive components 176 are formed, the dielectric layer DI is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C. As shown in FIG. 13, the dielectric layer DI is then patterned such that a plurality of contact openings O5 are formed to expose the bottom surfaces of the conductive through vias TV. The number of the contact openings O5 is corresponding to the number of the conductive through vias TV.

Figure 14:
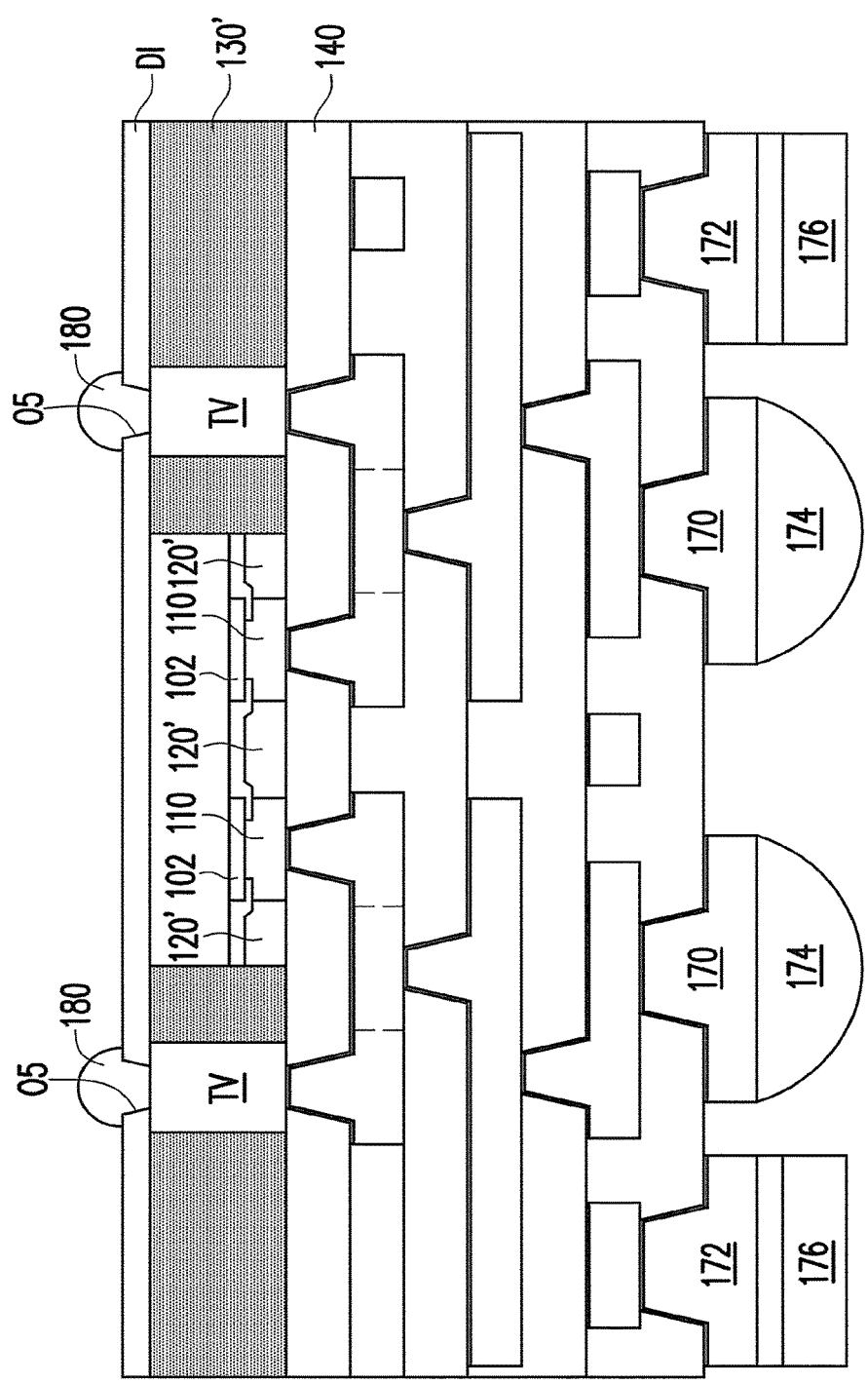

Referring to FIG. 14, after the contact openings O5 is formed in the dielectric layer DI, a plurality of conductive balls 180 are placed on the bottom surfaces of the conductive through vias TV that are exposed by the contact openings O5. And, the conductive balls 180 are, for example, reflowed to bond with the bottom surfaces of the conductive through vias TV. As shown in FIG. 14, after the conductive balls 174 and the conductive balls 180 are formed, an integrated fan-out package of the integrated circuit 100 having dual-side terminal is accomplished.

Figure 15:
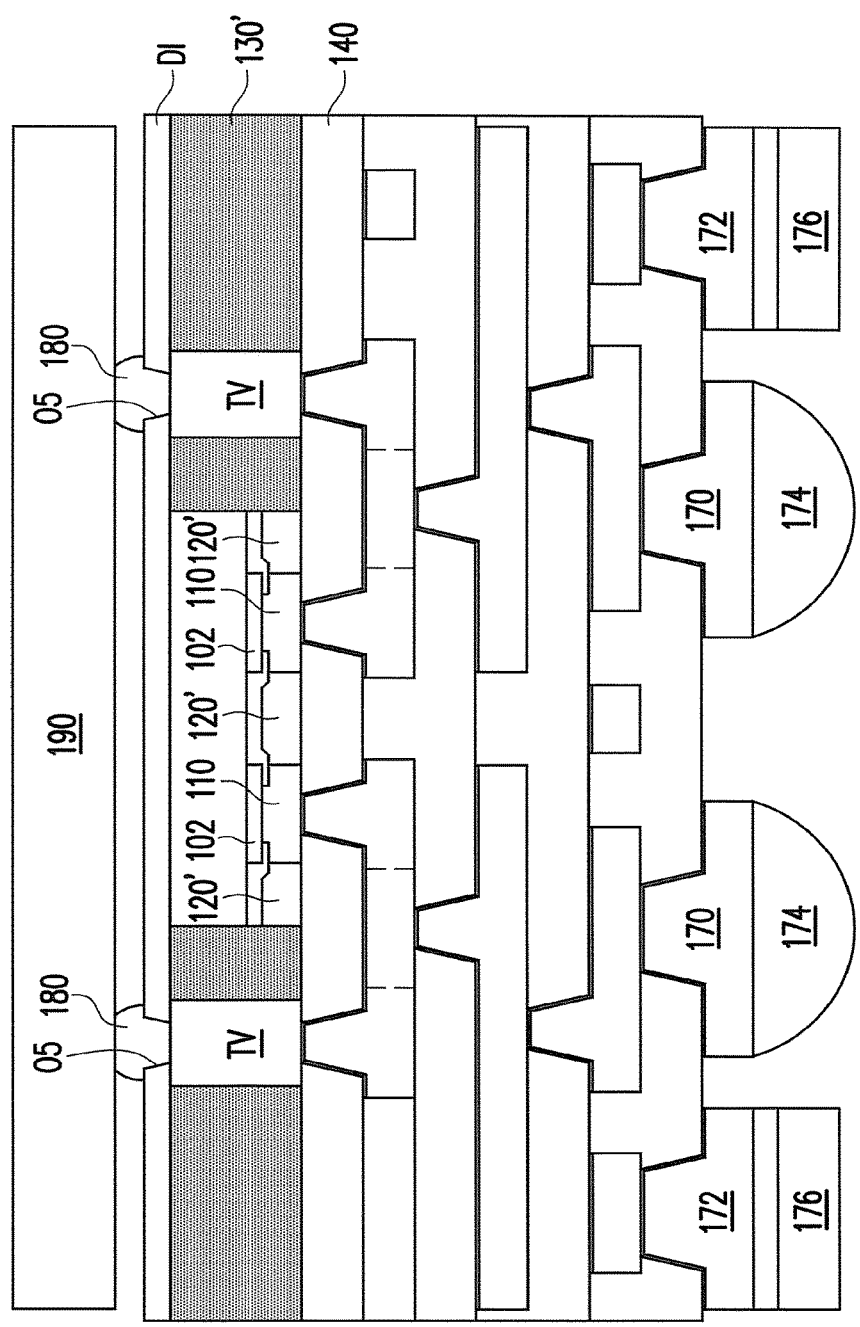

Referring to FIG. 15, another package 190 is then provided. In some embodiments, the package 190 is, form example, a memory device. The package 190 is stacked over and is electrically connected to the integrated fan-out package illustrated in FIG. 14 through the conductive balls 180 such that a package-on-package (POP) structure is fabricated.

In accordance with some embodiments of the present disclosure, a method of fabricating a redistribution circuit structure electrically connected to at least one conductor underneath is provided. The method includes the following steps. A dielectric layer is formed to cover the conductor, and the dielectric layer includes at least one contact opening for exposing the conductor. A seed layer is formed to cover the dielectric layer and the conductor. A patterned photoresist layer is formed on the seed layer, the patterned photoresist layer includes at least one opening and at least one trench, and the seed layer is exposed by the opening and the at least one trench. A multi-step plating process is performed to form a patterned conductive layer on the seed layer exposed by the opening and the at least one trench, the patterned conductive layer includes at least one redistribution conductive layer formed in the opening and at least one alignment mark formed in the at least one trench, wherein the redistribution conductive layer includes at least one conductive via electrically connected to the conductor through the at least contact opening, the multi-step plating process includes a plurality of plating steps, the plating current density and agitation of a former plating step among the plating steps is greater than those of a later plating step among the plating steps. The patterned photoresist layer is removed. The seed layer which is uncovered by the redistribution conductive layer and the alignment mark is removed so as to form a patterned seed layer after the patterned photoresist layer is removed.

In accordance with alternative embodiments of the present disclosure, a method of fabricating a redistribution circuit structure electrically connected to at least one conductor underneath is provided. The method includes the following steps. A dielectric layer is formed to cover the conductor, and the dielectric layer includes at least one contact opening for exposing the conductor. A seed layer is formed to cover the dielectric layer and the conductor. A patterned photoresist layer is formed on the seed layer, the patterned photoresist layer includes at least one opening and at least one trench, and the seed layer is exposed by the opening and the at least one trench. A multi-step plating process is performed to form a patterned conductive layer on the seed layer exposed by the opening and the at least one trench, the patterned conductive layer includes at least one redistribution conductive layer formed in the opening and at least one alignment mark formed in the at least one trench, wherein the redistribution conductive layer includes at least one conductive via electrically connected to the conductor through the at least contact opening, the multi-step plating process includes a first plating step performed under a first agitation and a second plating step performed under a second agitation, and the second agitation is stronger than the first agitation. The patterned photoresist layer is removed. The seed layer which is uncovered by the redistribution conductive layer and the alignment mark is removed so as to form a patterned seed layer after the patterned photoresist layer is removed.

In accordance with yet alternative embodiments of the present disclosure, a method of fabricating a redistribution circuit structure electrically connected to at least one conductor underneath is provided. The method includes the following steps. A dielectric layer is formed to cover the connector, and the dielectric layer includes at least one contact opening for exposing the conductor. A seed layer is formed on the integrated circuit to cover the dielectric layer and the conductor. A patterned photoresist layer is formed on the seed layer, wherein the patterned photoresist layer includes at least one opening and at least one trench, and the seed layer is exposed by the opening and the trench. A multi-step plating process is performed to form a patterned conductive layer on the seed layer exposed by the opening and the trench. The patterned conductive layer includes at least one redistribution conductive layer formed in the opening and at least one alignment mark formed in the trench, and the redistribution conductive layer includes at least one conductive via electrically connected to the conductor through the contact opening. The alignment mark comprises a base portion on the dielectric layer and a protruding portion on the base portion, and a ratio of a maximum thickness of the protruding portion to a thickness of the base portion is smaller than 25%. The patterned photoresist layer is removed. After the patterned photoresist layer is removed, the seed layer which is uncovered by the redistribution conductive layer and the alignment mark is removed so as to form a patterned seed layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a redistribution circuit structure electrically connected to at least one conductor, the method comprising:
    forming a dielectric layer covering the conductor, the dielectric layer comprising at least one contact opening for exposing the conductor;
    forming a seed layer to cover the dielectric layer and the conductor;
    forming a patterned photoresist layer on the seed layer, the patterned photoresist layer comprising at least one opening and at least one trench, and the seed layer being exposed by the opening and the at least one trench;
    performing a multi-step plating process to form a patterned conductive layer on the seed layer exposed by the opening and the at least one trench, the patterned conductive layer comprising at least one redistribution conductive layer formed in the opening and at least one alignment mark formed in the at least one trench, the redistribution conductive layer comprising at least one conductive via electrically connected to the conductor through the at least contact opening, wherein the multi-step plating process comprises a plurality of plating steps, plating current density and agitation of a former plating step among the plating steps is greater than those of a later plating step among the plating steps;
    removing the patterned photoresist layer; and
    removing the seed layer uncovered by the redistribution conductive layer and the alignment mark to form a patterned seed layer after the patterned photoresist layer is removed.

2. The method of claim 1, wherein the plating steps comprise:
    a first plating step for forming a first plated conductive layer on the seed layer exposed by the openings and the at least one trench; and
    a second plating step for forming a second plated conductive layer on the first plated conductive layer.

3. The method of claim 2, wherein the first plating step is performed under a first plating current density and a first agitation, the second plating step is performed under a second plating current density and a second agitation, the first plating current density is greater than the second plating current density, and the second agitation is stronger than the first agitation.

4. The method of claim 3, wherein the first plating current density is greater than 2 ASD and the second plating current density is less than 2 ASD.

5. The method of claim 1, wherein the seed layer uncovered by the redistribution conductive layer and the alignment mark is removed by etching to form the patterned seed layer.

6. The method of claim 1, wherein the alignment mark comprises a base portion on the dielectric layer and a protruding portion on the base portion, and a ratio of a maximum thickness of the protruding portion to a thickness of the base portion is smaller than 25%.

7. The method of claim 6, wherein the at least one conductive via comprises a depression formed on a top surface thereof, and a minimum distance from the conductor to a bottom of the depression is greater than a depth of the depression.

8. A method of fabricating a redistribution circuit structure electrically connected to at least one conductor, the method comprising:
    forming a dielectric layer covering the conductor, the dielectric layer comprising at least one contact opening for exposing the conductor;
    forming a seed layer to cover the dielectric layer and the conductor;
    forming a patterned photoresist layer on the seed layer, the patterned photoresist layer comprising at least one opening and at least one trench, and the seed layer being exposed by the opening and the at least one trench;
    performing a multi-step plating process to form a patterned conductive layer on the seed layer exposed by the opening and the at least one trench, the patterned conductive layer comprising at least one redistribution conductive layer formed in the opening and at least one alignment mark formed in the at least one trench, the redistribution conductive layer comprising at least one conductive via electrically connected to the conductor through the at least contact opening, wherein the multi-step plating process comprises a first plating step performed under a first agitation and a second plating step performed under a second agitation, and the second agitation is stronger than the first agitation;
    removing the patterned photoresist layer; and
    removing the seed layer uncovered by the redistribution conductive layer and the alignment mark to form a patterned seed layer after the patterned photoresist layer is removed.

9. The method of claim 8, wherein the plating steps comprise:

a first plating step for forming a first plated conductive layer on the seed layer exposed by the openings and the at least one trench; and a second plating step for forming a second plated conductive layer on the first plated conductive layer.

10. The method of claim 9, wherein the first plating step is performed under the first agitation and the second plating step is performed under the second agitation.

11. The method of claim 8, wherein the seed layer uncovered by the redistribution conductive layer and the alignment mark is removed by etching to form the patterned seed layer.

12. The method of claim 8, wherein the alignment mark comprises a base portion on the dielectric layer and a protruding portion on the base portion, and a ratio of a maximum thickness of the protruding portion to a thickness of the base portion is smaller than 25%.

13. The method of claim 12, wherein the at least one conductive via comprises a depression formed on a top surface thereof, and a minimum distance from the conductor to a bottom of the depression is greater than a depth of the depression.

14. A method of fabricating a redistribution circuit structure electrically connected to at least one conductor underneath, the method comprising:

forming a dielectric layer covering the conductor, the dielectric layer comprising at least one contact opening for exposing the conductor;

forming a seed layer to cover the dielectric layer and the conductor;

forming a patterned photoresist layer on the seed layer, the patterned photoresist layer comprising at least one opening and at least one trench, and the seed layer being exposed by the opening and the at least one trench;

performing a multi-step plating process to form a patterned conductive layer on the seed layer exposed by the opening and the at least one trench, the patterned conductive layer comprising at least one redistribution conductive layer formed in the opening and at least one alignment mark formed in the at least one trench, the redistribution conductive layer comprising at least one conductive via electrically connected to the conductor through the at least one contact opening, wherein the alignment mark comprises a base portion on the dielectric layer and a protruding portion on the base portion, and a ratio of a maximum thickness of the protruding portion to a thickness of the base portion is smaller than 25%;

removing the patterned photoresist layer; and removing the seed layer uncovered by the redistribution conductive layer and the alignment mark to form a patterned seed layer after the patterned photoresist layer is removed.

15. The method of claim 14, wherein the multi-step plating process comprises:

performing a first plating process to form a first plated conductive layer on the seed layer exposed by the openings and the at least one trench; and performing a second plating process to form a second plated conductive layer on the first plated conductive layer.

16. The method of claim 15, wherein the first plating process is performed under a first plating current density and a first agitation, the second plating process is performed under a second plating current density and a second agitation, the first plating current density is higher than the second plating current density.

17. The method of claim 16, wherein the second agitation is stronger than the first agitation.

18. The method of claim 14, wherein the first plating current density is greater than 2 ASD and the second plating current density is less than 2 ASD.

19. The method of claim 14, wherein the seed layer uncovered by the redistribution conductive layer and the alignment mark is removed by etching to form the patterned seed layer.

20. The method of claim 14, wherein the at least one conductive via comprises a depression formed on a top surface thereof, and a minimum distance from the conductor to a bottom of the depression is greater than a depth of the depression.

* * * * *